United States Patent
Moon et al.

(10) Patent No.: US 6,799,826 B2
(45) Date of Patent: Oct. 5, 2004

(54) DEVICE AND METHOD FOR FABRICATING DISPLAY PANEL HAVING INK-JET PRINTING APPLIED THERETO

(75) Inventors: Eun A Moon, Seoul (KR); Bum Jin Bae, Seoul (KR); Young Jae Cho, Seoul (KR); Ji Hoon Sohn, Gyeonggi-do (KR); Byung Gil Ryu, Seoul (KR)

(73) Assignee: LG Electronics Inc., Seoul (KR)

( * ) Notice: Subject to any disclaimer, the term of this patent is extended or adjusted under 35 U.S.C. 154(b) by 32 days.

(21) Appl. No.: 10/406,218

(22) Filed: Apr. 4, 2003

(65) Prior Publication Data

US 2003/0189606 A1 Oct. 9, 2003

(30) Foreign Application Priority Data

Apr. 8, 2002 (KR) ..................................... P 2002-18970

(51) Int. Cl.[7] .................................................. B41J 2/21
(52) U.S. Cl. ............................. 347/19; 445/24; 427/168
(58) Field of Search ................................. 427/165, 168; 445/24; 347/2, 8, 19, 104

(56) References Cited

U.S. PATENT DOCUMENTS

| | | | | |
|---|---|---|---|---|
| 6,068,374 A | * | 5/2000 | Kurata et al. | 347/108 |
| 6,145,981 A | * | 11/2000 | Akahira et al. | 347/107 |
| 6,298,783 B1 | * | 10/2001 | O'Mera et al. | 101/486 |
| 6,478,485 B1 | * | 11/2002 | Niestrath | 400/120.07 |
| 6,554,398 B2 | * | 4/2003 | Wyngaert et al. | 347/42 |
| 6,582,048 B1 | * | 6/2003 | Akahira et al. | 347/19 |
| 6,660,332 B2 | * | 12/2003 | Kawase et al. | 427/266 |

* cited by examiner

*Primary Examiner*—Thinh Nguyen
*Assistant Examiner*—Julian D. Huffman
(74) *Attorney, Agent, or Firm*—Fleshner & Kim LLP

(57) ABSTRACT

A device and method for fabricating a display panel having ink-jet printing applied thereto is disclosed, in which it is possible to simplify fabricating process steps and to reduce production cost, and to prevent pattern failure. The device includes a stag having a hole and supporting a substrate; one or more ink-jet heads having nozzles spraying pattern forming solution onto the substrate; and one or more cameras positioned below the stage so as to monitor the nozzles through the holes.

9 Claims, 5 Drawing Sheets

DEVICE AND METHOD FOR FABRICATING DISPLAY PANEL HAVING INK-JET PRINTING APPLIED THERETO

This application claims the benefit of the Korean Application No. P2002-18970 filed on Apr. 8, 2002, which is hereby incorporated by reference.

BACKGROUND OF THE INVENTION

1. Field of the Invention

The present invention relates to device and method for fabricating a display panel, more particularly, to device and method for fabricating a display panel having ink-jet printing applied thereto for reducing a production cost and preventing a pattern failure.

2. Background of the Related Art

In general, cathode-ray tubes (CRT) have been mostly used as information displays. However, with digitization of information, a new concept of display is required by environmental changes. For example, compact displays obtaining thinness and lightness with low power consumption are required in an environment requiring mobility, such as cars, or airplanes, or portable computers. Meanwhile, large sized displays with high luminance and wide viewing angle are required in an environment in which delivery of information to the mass of people is required.

Recently, researches and development for flat panel displays (FPD) are actively performed in that the FPDs are suitable for a variety of environments as explained above. There are the flat panel displays such as liquid crystal display (LCD), plasma display panels (PDP), field emitting displays (FED), and electroluminescent displays (ELD).

For commercialization of the displays, it is required to simplify fabricating process steps, thereby decreasing production cost. Especially, it is important to reduce cost in a panel patterning process since the panel patterning process requires expensive equipment and complicated fabricating process steps.

In a related art patterning process, photolithography and screen-printing method are mostly used. In this related art process, though thin and even pattern is available, the photolithography has a high material cost, and complicated fabricating process steps such as deposition, masking, etching, and the like, are required. The screen-printing method has simple fabricating process steps, and fabricating equipment used in the screen-printing method is not expensive as compared to the photolithography, however, it is hard to obtain thin and even pattern in the screen-printing method.

SUMMARY OF THE INVENTION

Accordingly, the present invention is directed to device and method for fabricating a display panel having ink-jet printing applied thereto that substantially obviates one or more of the problems due to limitations and disadvantages of the related art.

An object of the present invention is to provide device and method for fabricating a display panel having ink-jet printing applied thereto, in which it is possible to simplify fabricating process steps and to reduce production cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a device for fabricating a display panel having ink-jet printing applied thereto includes a stage including a hole and supporting a substrate; one or more ink-jet heads having nozzles spraying pattern forming solution onto the substrate; and one or more cameras positioned below the stage so as to monitor the nozzles through the holes.

Preferably, the holes of the stage are aligned to be correspondent with align marks of the substrate.

Preferably, the device further includes a head control means for controlling a rotation angle of the ink-jet heads according to intervals between the patterns, and the head control means turns the ink-jet headers at a great angle with reference to a direction perpendicular to a length direction of the patterns as the interval between the patterns becomes smaller.

Preferably, the device further includes one or more monitors monitoring the nozzles with grids having a predetermined distance according to the interval between the patterns intended to form.

In another aspect of the present invention, a device for fabricating a display panel having ink-jet printing applied thereto includes a stage supporting a substrate having align marks, and having holes for being corresponding to the align marks; a plurality of rotary ink-jet heads having nozzles spraying pattern forming solution onto the substrate; cameras being fitted below each hole of the stage for monitoring the nozzles through the holes; and monitors being connected with the cameras so as to monitor the nozzles with grids having a fixed interval according to an interval between the patterns intended to form.

In another aspect of the present invention, a method for fabricating a display panel having ink-jet printing applied thereto includes the steps of (a)setting ink-jet heads; (b) monitoring positions of the nozzles of the ink-jet heads by monitoring grids having the fixed interval according to the interval of the patterns; (c)arranging the substrate on the stage; and (d)spraying pattern forming solution into the substrate through the nozzles of the ink-jet heads in a state of moving the substrate.

Preferably, the ink-jet heads are set to be turned at a predetermined angle according to the interval between the patterns intended to form, and the ink-jet heads are turned at a great angle with reference to a direction perpendicular to a length direction of the patterns as the interval of the patterns becomes smaller.

Preferably, the holes of the stage are aligned to be correspondent with the align marks of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
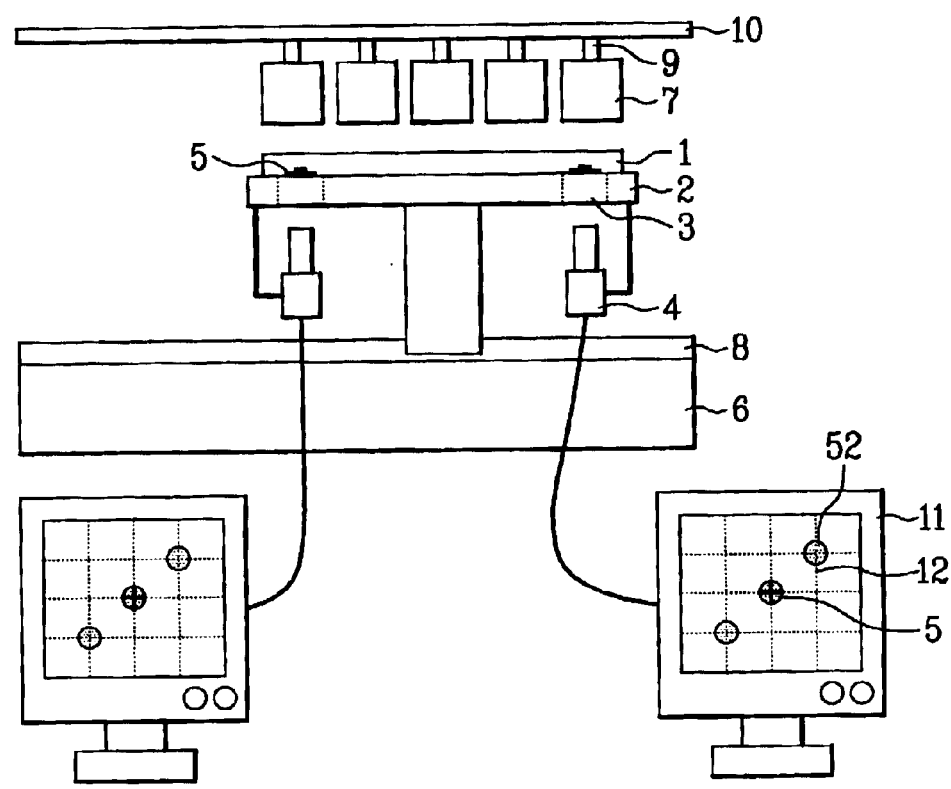
FIG. 1 illustrates a (representative) view of a device for fabricating a display panel having ink-jet printing applied thereto in accordance with a preferred embodiment of the present invention.
Figure 2:
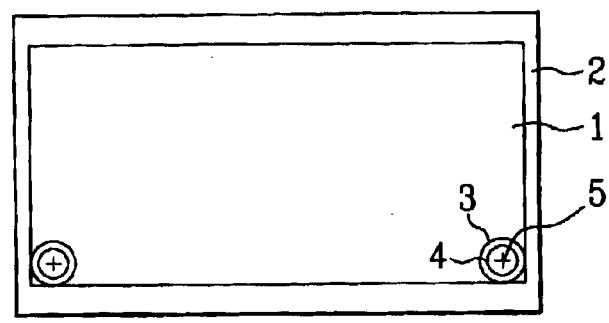
FIG. 2 illustrates a plan view of a stage and a substrate in FIG. 1.

Reference will now be made in detail to the preferred embodiments of the present invention, examples of which are illustrated in the accompanying drawings. FIG. 1 illustrates a (representative) view of a device for fabricating a display panel having ink-jet printing applied thereto in accordance with a preferred embodiment of the present invention. FIG. 2 illustrates a plan view of a stage and a substrate in FIG. 1.

Referring to FIG. 1 and FIG. 2, a device for fabricating a display panel having ink-jet applied thereto in accordance with a preferred embodiment of the present invention includes a stage 2, a plurality of ink-jet heads 7, and one or more CCD cameras 4. The stage 2 including one or more holes supports a substrate 1, and each ink-jet head 7 has a nozzle 52 spraying pattern forming solution onto the substrate 1. Also, each CCD camera 4 is fixed below each hole 3 for monitoring positions of the nozzles 52 through the holes 3 of the stage 2.

At this time, the substrate 1 may be a transparent glass substrate or a plastic substrate coated with indium tin oxide (ITO) according to the kind of the display. The pattern forming solution may be one of solutions for forming patterns of the display panel, such as a color filter layer, an alignment film, fluorescent material, electrodes, dielectric layer, and the like. The holes 3 of the stage 2 are arranged for being aligned with align marks 5 of the substrate 1. Furthermore, rails 8 are arranged on a base 6 below the stage 2 for moving the stage 2 in left/right directions. On the ink-jet heads 7, a head support means 10 is arranged so as to support the ink-jet heads 7, and a head control means 9 is arranged for rotating the ink-jet heads 7.

Figure 3:
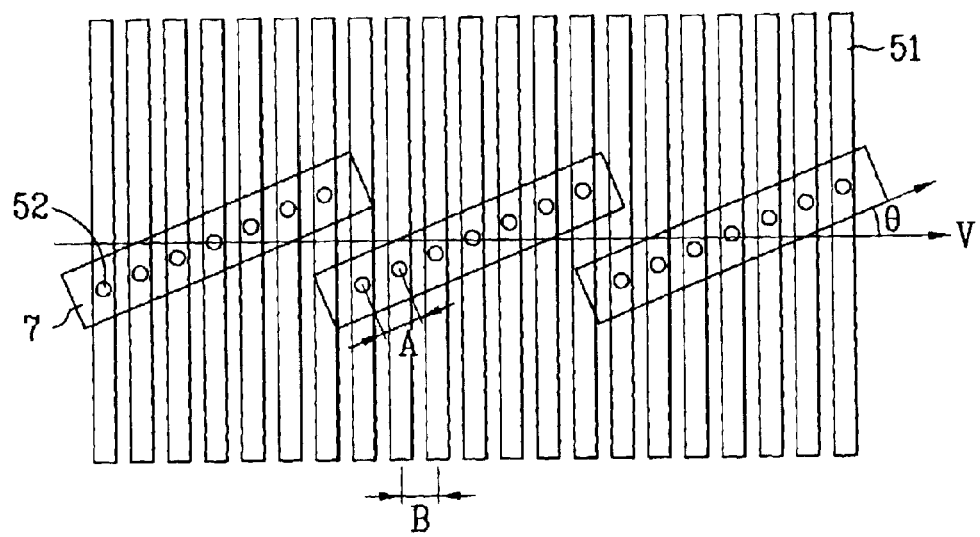
FIG. 3 illustrates an arrangement view of ink-jet heads in a device for fabricating a display panel having ink-jet printing applied thereto in accordance with one preferred embodiment of the present invention.
Figure 4:
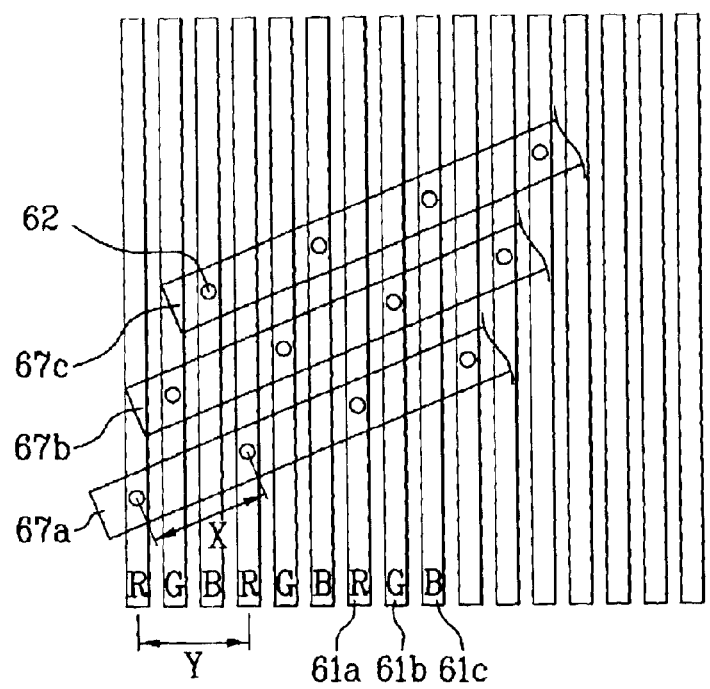
FIG. 4 illustrates an arrangement view of ink-jet heads in a device for fabricating a display panel having ink-jet printing applied thereto in accordance with another preferred embodiment of the present invention.

As shown in FIG. 3 and FIG. 4, the head control means 9 rotates the ink-jet head 7 at a predetermined angle according to an interval between the patterns being intended to form on the substrate 1. The head support means 10 can move the ink-jet heads 7 in up/down directions for adjusting an interval between the ink-jet heads 7 and the substrate 1. Also, the ink-jet heads may be formed at 1 to 100 according to the pattern that the user intends to form, and the pattern can be formed by one flow of process. In order to accurately determine the positions of the nozzles 52, monitors for showing grids 12 at a predetermined distance according to a pitch B between the patterns 51 for being intended to print are respectively connected to the CCD cameras 4.

Figure 5:
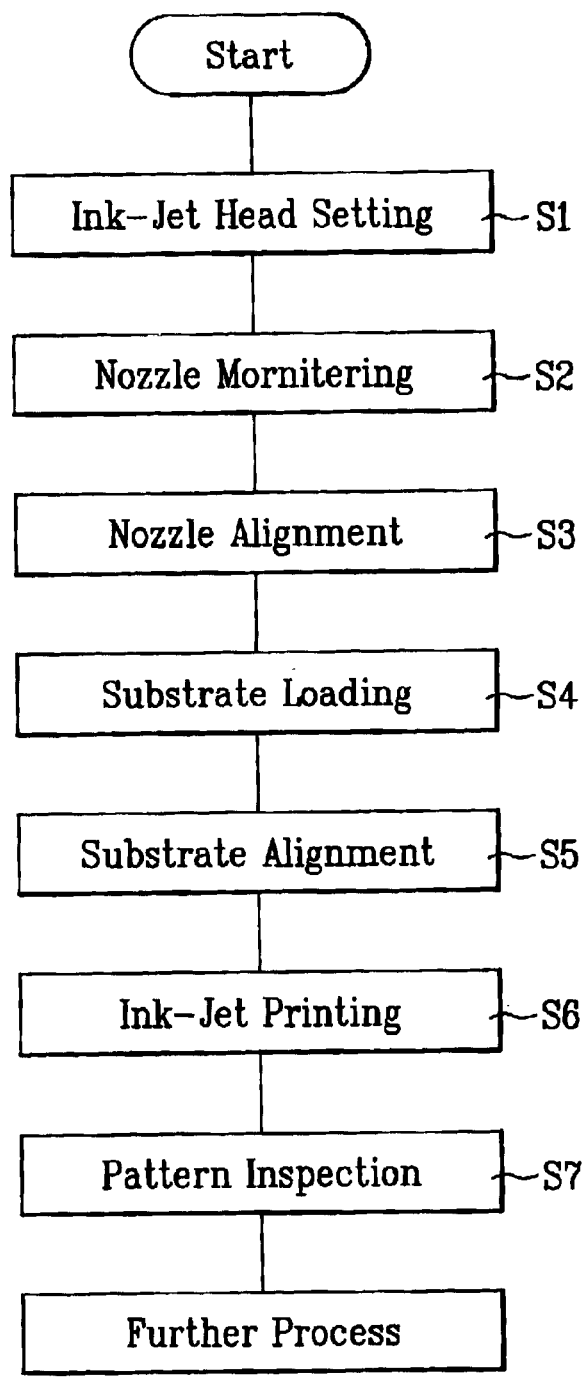
FIG. 5 illustrates a flow chart showing the steps of a method for fabricating a display panel having ink-jet printing applied thereto in accordance with the preferred embodiment of the present invention.
Figure 6A:
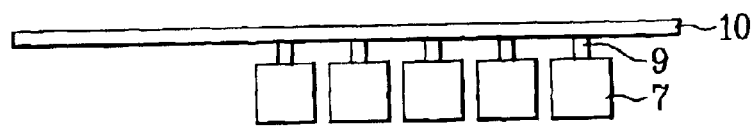
FIG. 6A to FIG. 6C illustrate views showing the steps of a method for fabricating a display panel having ink-jet applied thereto in accordance with the preferred embodiment of the present invention.
Figure 6B:
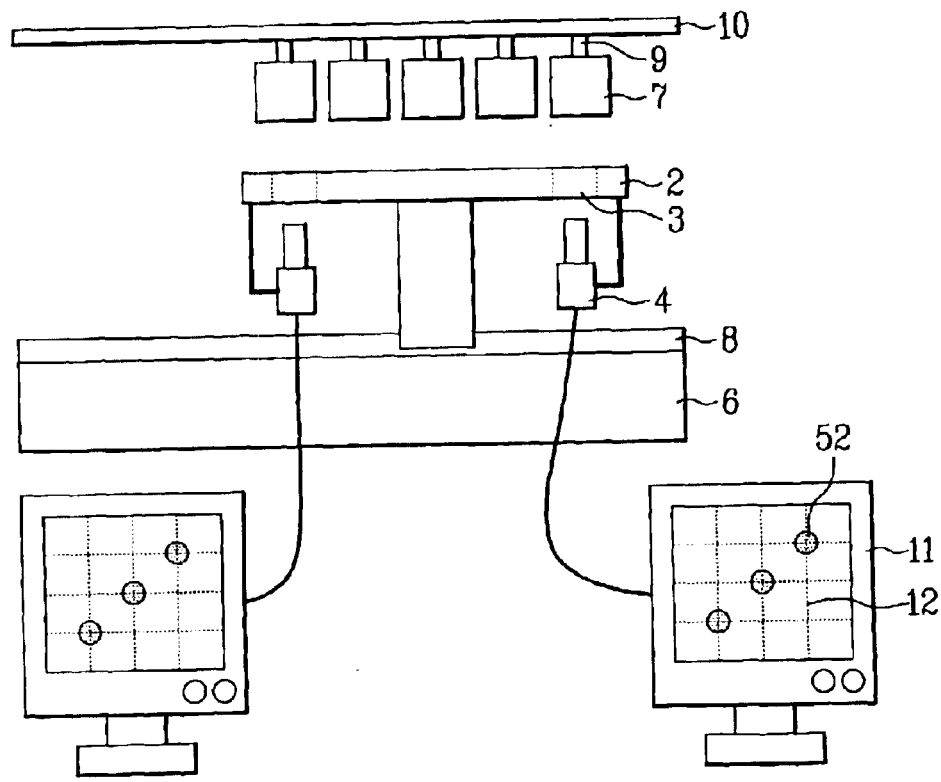
Figure 6C:
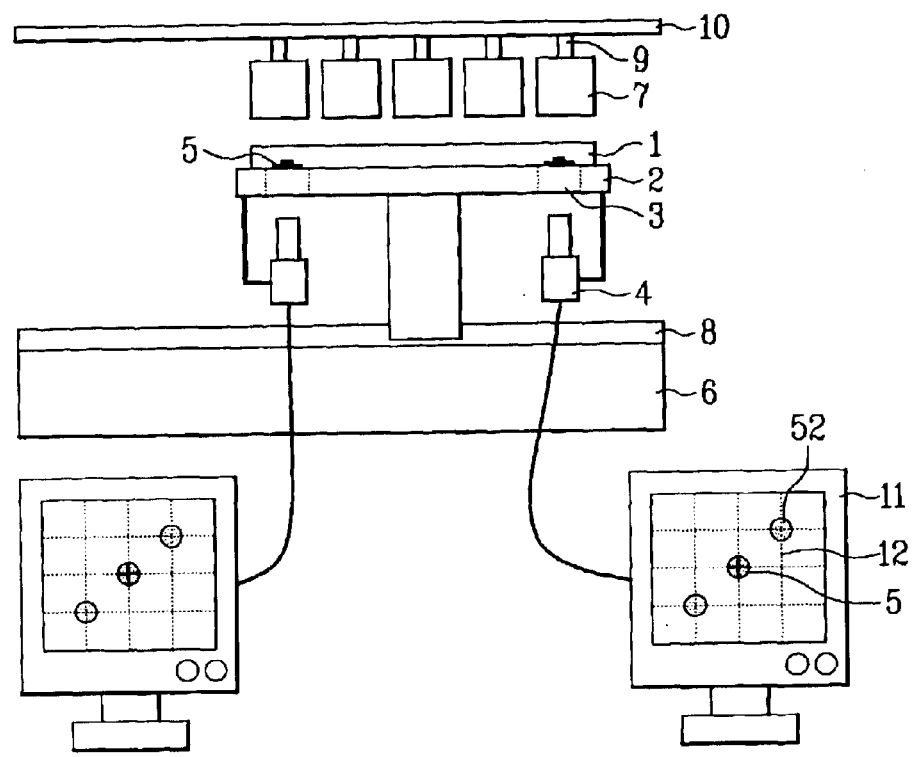

A method for fabricating the patterns of the display panel having the ink-jet applied thereto in accordance with the preferred embodiment of the present invention will be explained as follows. FIG. 5 illustrates a flow chart showing the steps of a method for fabricating a display panel having ink-jet printing applied thereto in accordance with the preferred embodiment of the present invention. FIG. 6A to FIG. 6C illustrate views showing the steps of a method for fabricating a display panel having ink-jet applied thereto in accordance with the preferred embodiment of the present invention.

As shown in FIG. 6A, the plurality of ink-jet heads 7 are set on the head support means 10 (S1), and the pattern forming solution is loaded to the ink-jet head 7 from a tube (not shown) storing the pattern forming solution. At this time, the ink-jet heads 7 of 1 to 100 may be provided, and the number of the ink-jet head 7 to be set corresponds with the number of the patterns 51 intended to form. For example, if it is intended to form 320 patterns 51 with the ink-jet head 7 having 32 nozzles by one flow of process, 10 ink-jet heads 7 have to be set.

Referring to FIG. 3, the ink-jet heads 7 are rotated at a predetermined angle θ by the head control means 200 according to the interval B between the patterns 51 intended to form, so that the ink-jet heads 7 are arranged to be oblique to a direction V perpendicular to a length direction of the patterns 51. Accordingly, even though an interval A between the nozzles 52 is wider than the interval B between the patterns 51, each nozzle 52 is positioned to be correspondent with each pattern 51.

The oblique angle θ of the ink-jet heads 7 with reference to the direction V perpendicular to the length direction of the patterns 51 is varied with the interval B between the patterns 51, resolution of the display. For example, as shown in FIG. 4, the color filter layers of PDP and LCD are composed of R, G and B patterns 61a, 61b, 61c being repeatedly arranged at fixed intervals. Meanwhile, in a case of 40-inch display with a VGA (Video Graphics Array) class resolution, the intervals 'Y' between the same color patterns are approx. 1.2 $\mu$m. As intervals 'X' of the nozzles 52 of the ink-jet heads 67a, 67b, 67c for spraying three kinds of solutions for forming the R, G, B patterns 61a, 61b, 61c are approx. 1.4 $\mu$m, for arranging the nozzles 62 to corresponding positions of the patterns, it is required that the ink-jet heads 67a, 67b, 67c are arranged oblique by approx. 32° with reference to a direction perpendicular to a length direction of the R, G, B patterns 61a, 61b, 61c.

In a case of a display with a WXGA class resolution of a resolution higher than the display with a VGA class resolution, for arranging the nozzles 62 to corresponding positions of the patterns, it is required that the ink-jet heads 67a, 67b, 67c are arranged for being oblique by approx. 62° with reference to a direction perpendicular to the length direction of the R, G, B patterns 61a, 61b, 61c. This is because the intervals of R, G, B patterns of the WXGA class are smaller than the intervals of the R, G, B patterns of the VGA class. That is, the higher the resolution of a display, the greater the oblique angle of the ink-jet heads 67a, 67b, and 67c.

Referring to FIG. 6B, position accuracy of the nozzles 52 of the ink-jet heads 7 is monitored with CCD cameras 4 and monitors 11 (S2). The CCD cameras 4 move with the stage 2 so as to sequentially monitor the ink-jet heads 7 through the holes 3 of the stage 2. At this time, the nozzles 52 being monitored have to be correspondent with the grids 12 of the monitor. If the positions of the nozzles 52 are not accurately correspondent with the grids 12, the nozzles 52 are correspondent with the grids 12 by rearranging the ink-jet heads 7.

Referring to FIG. 6C, after arranging positions of the nozzles 52 accurately, the substrate 1 is placed on the stage 2 (S4), and then the substrate 1 is set to a predetermined portion of the stage 2 (S5). At this time, it has to be checked whether align marks 5 of the substrate 1 are accurately aligned with each hole 3 of the stage 2 by the CCD cameras 4 and the monitors 11. In order to more accurately align the substrate 1, each align mark 5 has to be aligned for being correspondent with each nozzle 52 on the hole 3.

After that, for testing whole nozzles 52 of the ink-jet heads 7, a dummy patterning process is performed since most of abnormal signs occur, not while the nozzles 52 spray the pattern forming solution, but when the nozzles 52 start to spray the pattern forming solution. Also, the foreign matters at the entrance of the nozzles 52 may be removed by the dummy patterning.

Then, the nozzles 52 spray pattern forming solution onto the substrate 3 while the substrate 3 is moved along the rail 8 by the stage 2 (S6). In this instance, it is required that a viscosity of the pattern forming solution is adjusted in consideration characteristics of step coverage of the patterns intended to form. That is, when it is intended to form a pattern having good step coverage, the viscosity of the pattern forming solution is increased. In opposite case, the viscosity of the pattern forming solution is decreased. Accordingly, the device for fabricating a display panel having an ink-jet printing applied thereto according to the present invention can improve step coverage characteristics of the patterns, and can form uniform patterns.

After completing the pattern forming process, the substrate 1 is inspected (S7). Subsequently, the next process, i.e., if it is assumed that it is a process for forming the R, G, B color filter, is performed for carrying out heat treatment for hardening the pattern forming solution sprayed onto the substrate 1, and then the substrate 1 is moved to a baking oven along the rail (S8).

As has been explained, the device and method for fabricating a display panel having ink-jet printing applied thereto of the present invention have the following advantages.

By turning the ink-jet heads by the predetermined angle according to the interval between patterns, display panels having various resolutions can be fabricated, thereby decreasing a production cost.

Also, it is possible to prevent failure from generating due to a mismatching between the interval of the patterns and the interval of the nozzles.

The present invention is applicable, not only to the color filter process of a display panel, but to all processes, such as fluorescent material coating, formation of electrode and spacer, and the like.

It will be apparent to those skilled in the art that various modifications and variations can be made in the device and method for fabricating a display panel having ink-jet printing applied thereto of the present invention without departing from the spirit or scope of the invention. Thus, it is intended that the present invention cover the modifications and variations of this invention provided they come within the scope of the appended claims and their equivalents.

What is claimed is:

1. A device for fabricating a display panel having ink-jet printing applied thereto comprising:
   a stage including one or more holes and supporting a substrate;
   one or more ink-jet heads having nozzles spraying pattern forming solution onto the substrate; and
   one or more cameras positioned below the stage so as to monitor the nozzles through the one or more holes.

2. The device as claimed in claim 1, wherein the one or more holes of the stage are aligned to be correspondent with align marks of the substrate.

3. The device as claimed in claim 1, wherein the stage is movable in left and right directions.

4. The device as claimed in claim 1, further comprising a head control means for controlling a rotation angle of the ink-jet heads according to intervals between the patterns.

5. The device as claimed in claim 4, the head control means turns the ink-jet heads at a great angle with reference to a direction perpendicular to a length direction of the patterns as the interval between the patterns becomes smaller.

6. The device as claimed in claim 1, further comprising a head support means supporting the ink-jet heads.

7. The device as claimed in claim 1, further comprising one or more monitors monitoring the nozzles with grids having a predetermined interval according to the interval between the patterns intended to form.

8. The device as claimed in claim 1, further comprising a base having rails for transporting the stage.

9. A device for fabricating a display panel having ink-jet printing applied thereto comprising:
   a stage supporting a substrate having align marks, and having holes corresponding to the align marks;
   a plurality of rotary ink-jet heads having nozzles spraying pattern forming solution onto the substrate;
   cameras fitted below each hole of the stage for monitoring the nozzles through the holes; and
   monitors connected with the cameras so as to monitor the nozzles with grids having a predetermined interval according to an interval between the patterns intended to form.

* * * * *